(12) United States Patent
Montcalm et al.

(10) Patent No.: US 6,425,988 B1
(45) Date of Patent: Jul. 30, 2002

(54) METHOD AND SYSTEM USING POWER MODULATION FOR MASKLESS VAPOR DEPOSITION OF SPATIALLY GRADED THIN FILM AND MULTILAYER COATINGS WITH ATOMIC-LEVEL PRECISION AND ACCURACY

(76) Inventors: Claude Montcalm, 14 Jami St., Livermore, CA (US) 94550-3485; James Allen Folta, 2262 Hampton Rd., Livermore, CA (US) 94550-6512; Swie-In Tan, 19730 Graystone La., San Jose, CA (US) 95120; Ira Reiss, 1 Auburn Dr., New City, NY (US) 10956

( * ) Notice: Subject to any disclaimer, the term of this patent is extended or adjusted under 35 U.S.C. 154(b) by 0 days.

(21) Appl. No.: 09/711,441

(22) Filed: Nov. 13, 2000

Related U.S. Application Data

(63) Continuation-in-part of application No. 09/454,673, filed on Dec. 3, 1999.

(51) Int. Cl.$^7$ .................. C23C 14/34; B05D 1/00; B05C 11/00
(52) U.S. Cl. .................. 204/192.13; 204/298.03; 204/298.23; 204/298.27; 204/298.28; 427/8; 427/9; 427/10; 118/663; 118/665; 118/688
(58) Field of Search .................. 204/192.13, 298.03, 204/298.23, 298.27, 298.28; 427/8, 9, 10; 118/663, 665, 688

(56) References Cited

U.S. PATENT DOCUMENTS

| | | | |
|---|---|---|---|
| 5,240,583 A | 8/1993 | Ahonen | 204/298.04 |
| 6,010,600 A | 1/2000 | Vernon et al. | 204/192.11 |

OTHER PUBLICATIONS

*"Multilayer Coatings of 10X Projection Optics for Extreme Ultraviolet Lithography," C. Montcalm, et al., Emerging Lithographic Technologies III, March 15–17, 1999 SPIE Proceedings Series, vol. 3676, pp. 710–716.
*"Multilayer Coating of 10X Projection Optics for Extreme– Ultraviolet Lithography,"C. Montcalm et al., presented at the SPIE Conference on Microlithography— Emerging Lithographic Technologies III, at Santa Clara, California, Mar. 14–19, 1999 (12 pages).
*"Advances in Multilayer Reflective Coatings for Extreme– Ultraviolet Lithography," James A. Folta, et al., Emerging Lithographic Technologies III, Mar. 15–17, 1989 SPIE Proceedings Series vol. 3676 pp. 702–709.
*"Advance in Multilayer Reflective Coatings for Extreme– Ultraviolet Lithography," James A. Folta, et al., presented at the SPIE Conference on Microlithography —Emerging Lithographic Technologies III, at Santa Clara, California, during Mar. 14–19, 1999 (12 pages).

(List continued on next page.)

*Primary Examiner*—Rodney G. McDonald
(74) *Attorney, Agent, or Firm*—Sierra Patent Group, Ltd.; Andrew V. Smith

(57) ABSTRACT

A method and system for producing a film (preferably a thin film with highly uniform or highly accurate custom graded thickness) on a flat or graded substrate (such as concave or convex optics), by sweeping the substrate across a vapor deposition source operated with time-varying flux distribution. In preferred embodiments, the source is operated with time-varying power applied thereto during each sweep of the substrate to achieve the time-varying flux distribution as a function of time. A user selects a source flux modulation recipe for achieving a predetermined desired thickness profile of the deposited film. The method relies on precise modulation of the deposition flux to which a substrate is exposed to provide a desired coating thickness distribution.

14 Claims, 1 Drawing Sheet

OTHER PUBLICATIONS

*"Multilayer Reflective Coatings for Extreme–Ultraviolet Lithography," C. Montcalm, et al., proceedings of the SPIE Conference on Microlithography —Emerging Lithographic Technologies II, at Santa Clara, California, Feb. 23–25, 1998 SPIE Proceedings Series, vol. 3331, pp. 42–51.

*"Ni/$B_4$C Graded Multilayers for X–ray Applications," by Morawe, et al., (English language abstract distributed at Workshop on *Nanometer–scale Methods in X–ray Technology (NSMXT)*, Oct. 6–9, 1997, Costa da Caparica, Portugal.).

*"Design and Performance of Graded Multilayers as Focusing Elements for X–ray Optics," Morawe, et al., *Review of Scientific Instruments*, vol. 70, No. 8 Aug. 1999, pp. 3227–3232.

METHOD AND SYSTEM USING POWER MODULATION FOR MASKLESS VAPOR DEPOSITION OF SPATIALLY GRADED THIN FILM AND MULTILAYER COATINGS WITH ATOMIC-LEVEL PRECISION AND ACCURACY

CROSS-REFERENCE TO RELATED APPLICATION

The present application is a continuation-in-part of U.S. application Ser. No. 09/454,673, filed Dec. 3, 1999, by James A. Folta, Christopher C. Walton, and Claude Montcalm, the full text of which is hereby incorporated herein by reference.

BACKGROUND OF THE INVENTION

1. Field of the Invention

The present invention relates to methods of and systems for making thin films and multilayer coatings, and more specifically, it relates to a method for the production of axially symmetric, uniform or graded thickness thin film and multilayer coatings that avoid the use of apertures or masks to tailor the deposition profile.

2. Discussion of the Related Art

Thin film coatings are produced by various vapor-deposition methods (such as sputtering, chemical vapor deposition (CVD), electron beam evaporation, thermal evaporation, and ion beam plating) in which the substrate to be coated is passed through a vapor of the coating material and accumulates a thin film through condensation of the vapor. The ability to provide spatially graded thin film and multilayer coatings is essential for several advanced technologies. In particular, it is critical to developing optical fabrication techniques capable of fulfilling the stringent requirements of extreme ultraviolet lithography (EUVL) imaging systems, which require multiple aspheric optical elements figured to atomic-level accuracy. Multilayer coatings with the wrong thickness distribution would destroy the figure of the super-polished optics and would result in distorted lithographic patterns printed on the microelectronic circuits. In order to achieve the optimum imaging performance, graded period multilayer coatings must be deposited on these aspheric surfaces to within 0.1% accuracy, i.e., to within 0.01 nm for the typical coatings required for EUVL imaging optics.

Spatially graded thin film coatings are typically obtained with carefully shaped masks, or apertures, inserted between the sources and substrates. A different mask is required for each source-substrate combination. The masking operation requires iteration of the shape of the mask, and can be impractical for cases where perfect thickness distribution control is required at the location that coincides with the axis of rotation. At best, this is a tedious and inefficient process that is inappropriate for a robust manufacturing technique. The use of masks or baffles also lacks flexibility when several substrates must be coated in the same deposition run using several deposition sources. If differently customized masks are attached in close proximity to the substrates to intercept part of the incident deposition flux, custom coating gradients can be obtained for each substrate but one cannot independently control the flux emitted by each source. On the other hand, if differently customized masks are installed over the sources to shape the outgoing deposition flux, customized coating gradients can be obtained from each source but one cannot independently control the coating gradients deposited on several different substrates. Finally, since the source distribution flux can change over time as the source or target is consumed, the mask shape may require modification. This would require another mask fabrication and perhaps venting the chamber to atmosphere (undesirable) to install the new mask. As will be apparent from the description below, the present invention avoids use of baffles or masks, allows independent deposition of two different coating distributions on a substrate as the substrate sweeps sequentially across two sources during a single platter rotation, and also allows independent deposition of different coating distributions on several substrates coated in the same deposition run, each of which sweeps sequentially across a source.

U.S. Pat. No. 6,010,600, issued Jan. 4, 2000, to Vernon and Ceglio and U.S. patent application Ser. No. 09/454,673 by Walton, Montcalm and Folta disclose a technique for improving thickness distribution control during vapor deposition and circumvent the noted limitations of conventional masking methods. Instead of masking areas of the source flux, an optimal substrate sweep velocity recipe is determined and the substrate is swept through the deposition zone with a time-varying sweep velocity specified by such recipe. An aspect of the technique is a computer-implemented method for calculating the optimal substrate sweep velocity recipe for obtaining the desired thickness distribution profile. The technique disclosed in these references is specific to systems in which a substrate moves with time-varying sweep velocity across one or more stationary sources (or in which each source moves with time-varying sweep velocity relative to a stationary substrate), each of the sources emitting a fixed deposition flux. The inventors of the present invention, however, have recognized that it can be difficult to engineer and control such systems in which a load of multiple, heavy substrates (or vapor deposition sources) must be precisely accelerated and decelerated to various velocities within very short distances. The requirements for acceleration and deceleration of heavy substrates can significantly complicate the design of the substrates' drive mechanism and increase the cost of the vapor deposition tool.

An important aspect of the present invention is another maskless approach for the production of laterally graded or uniform thin film coatings on arbitrarily shaped substrates, in which one modulates the power applied to each source (or otherwise modulates the flux distribution of each source) instead of modulating the sweep velocity of the substrate relative to each source (or of each source relative to the substrate). The present invention has all the advantages of the velocity modulation method described in the above-referenced parent application (over conventional masking methods), while eliminating the need for special mechanical drive requirements for modulating substrate (or source) sweep velocity.

Until the present invention, it had not been known how to achieve deposited coating thickness distribution control (graded or ungraded) of better than 0.1% across typical substrates (including curved substrates such as EUV optics as well as flat substrates), without the need for modulating substrate (or source) sweep velocity.

Prior to the present invention, it had been known to set the power applied to a vapor deposition source to achieve a desired deposition rate (a desired thickness per unit of time of a layer deposited on a substrate held fixed relative to the source). It had also been known to apply a level of power to a vapor deposition source which determines a desired deposition rate from a source, which in turn determines a nominal thickness of a layer (e.g., a thin film or one layer of a multilayer coating) deposited by the source onto a spinning substrate during a sweep (with fixed velocity) of the spinning substrate across the source. However, until the present invention it had not been proposed to modulate the power applied to a vapor deposition source (or otherwise to modulate the flux distribution of such a source) while sweeping a spinning or non-spinning substrate across the source, in order to deposit on the substrate a layer having a desired thickness distribution profile across the substrate.

It is expected that the invention will be useful in many applications, including precise deposition of laterally uniform or graded thin film coatings for EUV lithography, EUV optics, lithography masks, and optical coatings for general applications such as microscopy, astronomy, and spectroscopy, production of specifically graded coatings on curved optical elements, precise modification of the surface figure of optical elements for fabrication of aspheric optics, and production of extremely uniform films for semiconductor or magnetic recording devices.

SUMMARY OF THE INVENTION

In preferred embodiments, the invention is a method and system for depositing a thin film with highly accurate custom graded (or highly uniform) thickness over a substrate surface, by exposing the substrate to a region containing a vapor of the coating substance (referred to as a vapor deposition "source" of coating material) in which the flux density is controlled. A thin film having a predetermined thickness profile is deposited on the substrate surface by sweeping the substrate across the source while controlling the source flux distribution in accordance with a selected source flux modulation recipe.

Typically, the source flux modulation recipe is a power modulation recipe specifying the power applied to the source as a function of time during the time interval in which the substrate sweeps across the source. In general, the source flux modulation recipe specifies how the flux distribution of the source varies over time (while the substrate sweeps across the source with constant velocity). This invention is applicable not only to flat substrates, but also to both concave and convex curved optics (i.e., optics having non-zero curvature).

DETAILED DESCRIPTION OF PREFERRED EMBODIMENT

Figure 1:
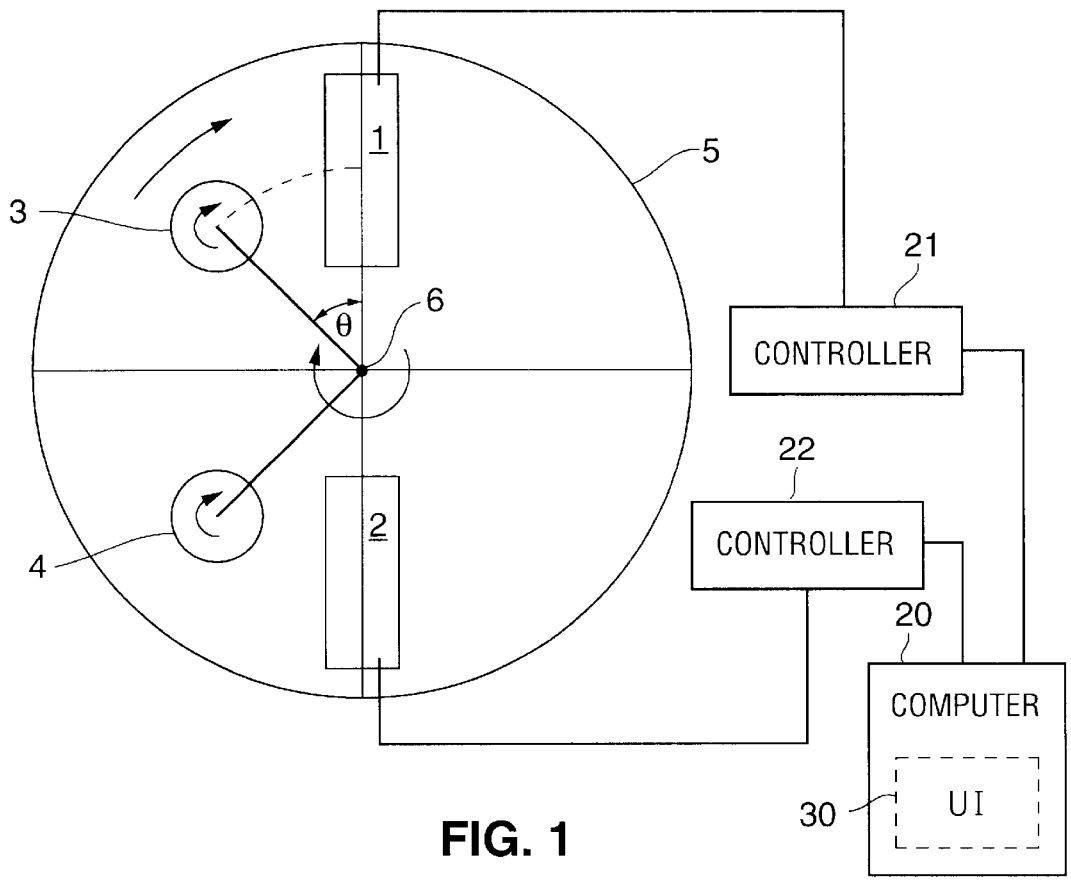
FIG. 1 is a cross-sectional view of a DC magnetron sputtering system which embodies the invention.

The invention pertains to methods and systems for vapor deposition (such as sputtering, CVD, and electron beam evaporation, thermal evaporation, and ion-beam plating methods and systems) in which a substrate to be coated is passed through a vapor of the coating material and accumulates a film (typically a very thin film) of the coating material through condensation of the vapor.

The invention provides a method of producing uniform or graded thin film and multilayer coatings on substrates with any surface curvature in a manner avoiding use of apertures or masks to tailor the deposition flux profile. In accordance with the invention, the power applied to a vapor deposition source is modulated (or the flux distribution of the source is otherwise modulated) as one or more substrates sweep across the source with controlled velocity to generate a thicker or thinner coating in some substrate regions relative to other substrate regions. Typically, the substrate also spins relative to the source as it sweeps across the source.

The flux distribution can be modulated (other than by modulating the power applied to each source) such as by use of moving masks or modulation of a magnetic or electric field. Therefore, "source flux modulation" as used herein, including in the claims, is broadly intended to cover all methods of changing the flux from the deposition source as a function of time.

The amount of coating deposited at a particular point on the surface of a substrate depends on the time this point is exposed to the deposition flux of a source and the intensity of this flux during that time, which, in turn, depends on the velocity of the moving substrate and the power applied to the source, the deposition flux distribution profile of the source (for the applied power), and the substrate geometry (distance of the point from the source and angle of the surface normal at the point relative to the source). If a coating is too thin at one edge of the substrate when the substrate passes over the source of a constant velocity, one can increase the power applied to the source (and therefore increase the deposition flux) while only that edge is exposed to the source. This results in thicker coating in regions of the substrate coated at the higher power. Using this approach, complicated coating thickness distribution profiles can be obtained on substrates with various surface curvatures by using different power modulation recipes while the substrate is translated across the deposition zones. In preferred embodiments, the power applied to the source is computer controlled in accordance with a power modulation recipe selected by the user. The motion of the substrate across the source can be linear or rotational, can consist of single or multiple passes per layer, and can be partial or complete. The substrate can be rotated around its center of mass to produce a radially symmetrical thickness profile, or another rotation axis can be selected to obtain other distributions. The substrate can also be rotated at a variable velocity or not rotated at all. The present invention is applicable to any type of vapor deposition system in which each of one or more deposition sources is characterized by a deposition flux distribution.

There is a direct mapping between the coating thickness distribution and the substrate equation of motion and the deposition flux intensity (as a function of time) which is exploited in accordance with the invention to tailor the coating thickness distribution without the use of masks and apertures. An important advantage of fixing the substrate sweep velocity to a constant value is that this reduces considerably the engineering requirements of the substrate drive assembly (eliminating difficulties which would otherwise result in designing the substrate drive assembly to accelerate or decelerate heavy substrates with the required accuracy). Several different substrates can be coated with different thickness distribution profiles with several different deposition sources in a single deposition run, and only simple software changes (no hardware changes) for varying the recipe for modulating the power applied to the source (or otherwise modulating the source's flux distribution as a function of time) are required to accommodate a change in a desired thickness distribution profile or a change in the deposition flux due to source aging.

The invention allows precise thickness distribution control, with the power applied to each source being the primary process control variable, as a result of selecting a source flux modulation recipe (e.g., a power modulation recipe) for achieving a desired thickness profile, which recipe is easily changed with computer controls. Each source flux modulation recipe specifies how the flux distribution of the source varies over time (while the substrate sweeps across the source with constant velocity).

FIG. 1 is a cross-sectional view of a DC magnetron sputtering system which embodies the invention. In this embodiment, substrates 3 and 4 are rotatably mounted on platter 5. Platter 5 rotates about its central shaft 6. As platter 5 rotates, it sweeps substrates 3 and 4 across each of magnetron sources 1 and 2 in turn. Substrates 3 and 4 can be controlled to spin about their respective centers as platter 5 rotates. Controllers 21 and 22 are coupled to sources 1 and 2, respectively. Each of controller 21 and 22 modulates the power applied to the source to which it is coupled, thereby modulating the source flux. Computer 20 includes a display device and an input device (e.g., keyboard and mouse) and is programmed to implement the invention, including with software that implements user interface 30. Computer 20 receives instructions through user interface 30 and generates control signals (for operating controllers 21 and 22) in accordance with a source flux modulation recipe selected through the user interface 30. Controllers 21 and 22 operate in response to the control signals (e.g., in response to a first subset and a second subset of the control signals, respectively).

The system of FIG. 1 can be used to perform the inventive method by depositing on a substrate a coating having the desired thickness profile as the substrate is swept across one of the sources with a constant velocity and a time-dependent source flux distribution determined by the source flux modulation recipe selected by the user. In some embodiments, a multilayer coating (comprising pairs of sequentially deposited layers each having a desired thickness profile) is deposited on a substrate that is swept sequentially across both sources with a constant velocity and time-dependent source flux distribution (during each transit across a source) determined by the recipe selected by the user.

More specifically, a substrate 3 or 4 is swept across the source 1 or 2 according to a source flux modulation recipe (e.g., recipe for modulating the power supplied to magnetron sources 1 or 2 as a function of time). In typical cases, the substrate spins (relative to the platter) about its center at constant speed (much faster than the substrate sweep speed) while the platter 5 sweeps it across the source with constant velocity and the power applied to each source is varied via controllers 21 and 22, respectively. However, we also contemplate performing the deposition in other cases, such as cases where the substrate spins with a selected time-varying speed while it is swept across the source or cases where the substrate does not spin (relative to the platter) during at least part of the time that it is swept across the source. In selecting a source flux modulation recipe to achieve a desired thickness profile, one should take into account the level of power applied to the source, the source flux distribution for such level of power applied to the source, the sweep velocity of the substrate's center across the source, and the angular velocity at which the substrate spins relative to the platter.

In accordance with the invention, the thickness distribution profile (a profile of thickness of a film coating deposited on the substrate) is given by:

$$T(r) = \int_S \Phi(x, y, \Omega) dS$$

where T(r) is the film thickness at a radius r on the spinning substrate; S is the path of a point on radius r relative to the source; and $\Phi(x,y,\Omega)$ is the deposition rate of the source (referred to more generally herein as the flux distribution of the source) as a function of position (x,y) over the source for a specific level of power $\Omega$ applied to the source. The deposition rate $\Phi$ has units of nm/second, and has not only a position dependence but also a time dependence since $\Omega=\Omega(t)$ is a power modulation recipe that depends on time. The expression for path S of a given point on the substrate depends on the geometry of the deposition system (the substrate may be translated linearly across the source or according to a circular motion as in FIG. 1), the platter sweep velocity, and the spin rate of the substrate.

In a simple implementation of the invention, the power modulation recipe needed for achieving a desired thickness profile on a substrate requires only two power levels. The platter moves the substrate across the source at a constant sweep velocity, but in three stages, with a sequence of the two power levels applied to the source (while the substrate spins about its center relative to the platter at a specified spin speed, which can be zero): a first stage in which the source is operated at a first power while the platter moves the substrate relative to the source with only a leading portion of the substrate (including the leading edge but not the substrate's center) exposed to the source; a second stage in which the source is operated at a second power while the platter moves the substrate relative to the source with at least a central portion of the substrate including the substrate's center exposed to the source (in implementations in which the substrate spin speed is sufficiently large relative to the platter speed); and a third stage in which the source is operated at the first power while the platter moves the substrate relative to the source with only the trailing portion of the substrate (including the trailing edge but not the substrate's center) exposed to the source. In a final stage, in which the platter moves the substrate while no portion of the substrate is exposed to the source (e.g., after the trailing edge of the substrate has passed over the source), the power at which the source is operated is irrelevant and can have any value (except to the extent that such power is determined by a power requirement for another substrate, where both the first substrate and the other substrates are moved by the same platter).

Figure 2:
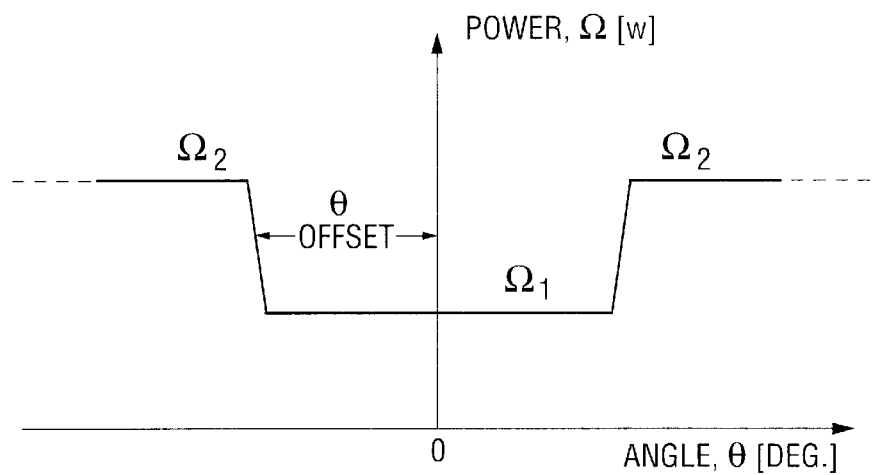
FIG. 2 is a graph representing an example of a dual-power recipe "$\Omega_1$" and "$\Omega_2$" that can be used to increase thickness of a coating at the edge of a substrate.

FIG. 2 is a graph representing such a typical dual-power recipe, in which the power of source 1 varies between "$\Omega_1$" and "$\Omega_2$" as a function of the angular position of the substrate relative to the source, for the system of FIG. 1, while substrate 3 passes over source 1. In FIG. 2, the offset angle $\theta_{offset}$ is the angle traversed by substrate 3 (as it is swept by the platter around the platter's central shaft and across source 1) from the time that the power level undergoes the transition from $\Omega_2$ to $\Omega_1$ until the angular position of the substrate is zero (0) degrees. The angular position of the substrate is zero when the center of the substrate is centered over the source. In implementing this dual-power recipe, the source is powered at the higher power $\Omega_2$ from the start of the recipe until the substrate has reached the offset angle $\theta_{offset}$. Then, the power applied to the source decreases to $\Omega_1$ and remains at $\Omega_1$ until the substrate center has reached a symmetric position on the other side of the source (i.e., when reaching the offset angle on the other side of the source). Then, the power applied to the source is set to $\Omega_2$ until the end of the pass. For simplicity, the power modulation recipes can be kept symmetrical in this way. The deposition run is considered to end when the angular position of the substrate is such that the substrate's trailing edge has left the source.

The present invention is not limited to source flux modulation recipes for achieving uniform thickness coatings (on flat or curved substrates). It can also be used with source flux modulation recipes for achieving coatings in which the coating thickness is graded (or otherwise varies) across a flat or curved substrate. Optical coatings commonly have such prescriptions in order to compensate for variations in the incident angle or wavelength of light across the optic. The invention thus eliminates the need for use of a precisely constructed shadow mask (e.g., made of sheet metal milled to block portions of the source, shaping it to deliver the desired thickness profile on the substrate) over each substrate to achieve a desired non-uniform coating on the substrate.

In some embodiments, the inventive method is used for depositing a custom film, having a very precise thickness profile, on a curved optic. Such a custom film can be an underlayer which underlies a multilayer coating, and which can alter the figure of the optic by hundreds of nanometers (or more). If a precision surface is produced and polished, and then found to have the wrong figure, the inventive method could be performed to correct the figure. We contemplate that such embodiments of the invention would typically be applied to correct overall shape; not to correct scratches and other localized errors.

Different embodiments of the invention assume different geometries for the apparatus employed to effect relative motion of the vapor deposition source and substrate, such that the substrate is exposed to the source to be coated by vapor deposition. Some embodiments (including the preferred embodiments described above) provide rotational motion of the substrate relative to one or more fixed sources. Others provide rotational motion of one or more sources relative to a fixed substrate. Other embodiments provide linear or other non-rotational motion of a substrate relative to a fixed source (or of a source relative to a fixed substrate). In the claims, the expression that a substrate "sweeps" (or is swept) across (or relative to) a source is intended to cover all such cases, including cases in which the substrate is fixed in some frame of reference and the source moves relative to the substrate in such frame of reference.

One class of preferred embodiments of the invention provides that the substrate undergoes rotational motion relative to a fixed source by being swept by a rotating platter relative to the source, while the substrate spins about its own central axis (or center of mass). In other embodiments, the substrate spins about a fixed axis while the source moves (rotationally, linearly, or otherwise) relative to the substrate. In other embodiments, the substrate undergoes linear or other non-rotational motion relative to a fixed source, while the substrate spins about its own central axis (or center of mass). In other embodiments, the substrate does not spin, spins with a selected time-varying speed, or spins about an axis other than its own central axis. In the claims, the expression that a substrate "spins" (or is spinning or spun) is intended to cover all such cases, including cases in which the substrate does not spin (in some frame of reference) but the source spins relative to the substrate.

In the preferred embodiments described with reference to FIG. 1, each substrate sequentially sweeps across two fixed sources during each full platter rotation. In other embodiments of the invention, a substrate sequentially sweeps across three or more fixed sources during each full platter rotation (or the substrate otherwise periodically sweeps across three or more sources), so that multilayer coatings can be conveniently deposited on the substrate. The motion of the substrate across the source can be linear or rotational, can consist of single or multiple passes per layer, and can be partial or complete.

The foregoing is merely illustrative and explanatory of preferred embodiments of the inventive methods and apparatus. Various changes in the details of the embodiments described herein may be within the scope of the appended claims. The invention pertains to methods and systems for vapor deposition such as methods and systems for sputtering (including DC magnetron sputtering, ion beam sputtering, as well as other types of sputtering), CVD, electron beam evaporation, thermal evaporation, and ion-beam plating.

What is claimed is:

1. A method for depositing a film on a substrate using a vapor deposition source, wherein the source has a different flux distribution when operated at each of a number of different applied power levels, said method including the steps of:

(a) selecting a source flux modulation recipe which is adequate to achieve a predetermined thickness profile for film deposition on the substrate as said substrate is swept across the source at constant velocity while the source is operated in accordance with said source flux modulation recipe; and (b) performing a vapor deposition operation in which the source deposits a film of the material on the substrate while said substrate is swept across the source at constant velocity and the source is operated in accordance with the selected source flux modulation recipe.

2. The method of claim 1, wherein the source is a magnetron sputtering deposition source, and step (b) includes the step of modulating a power level applied to the magnetron sputtering deposition source.

3. The method of claim 1, wherein during step (b) the substrate spins while it is swept across the source.

4. The method of claim 1, wherein during step (b) the source deposits the film of the material on a flat substrate.

5. The method of claim 1, wherein during step (b) the source deposits a film of the material on an optic having nonzero curvature.

6. The method of claim 1, wherein during step (b) the source deposits a film of the material on an optic having a figure to be corrected by deposition of the film on said optic, and wherein the source flux modulation recipe is such that deposition of the film onto the optic achieves a desired correction of said figure of the optic.

7. The method of claim 1, wherein step (b) includes the step of modulating the flux distribution of the source other than by modulating a power level applied to said source.

8. A system, including:

a vapor deposition apparatus including a vapor deposition source operable at each of a number of applied power levels and having a known flux distribution at each of the applied power levels, a substrate, a rotatable platter to which the substrate is mounted, and a platter drive assembly coupled to the platter and configured to rotate the platter to sweep the substrate across the source;

a programmed computer programmed with software implementing a user interface for selecting a source flux modulation recipe for achieving a predetermined thickness profile of a film deposited on the substrate as a result of sweeping said substrate across the source with a constant sweep velocity while the source is operated in accordance with said source flux modulation recipe, wherein the computer is configured to generate control signals in accordance with the selected source flux modulation recipe; and a controller coupled to the programmed computer and to the vapor deposition source, and configured to operate the vapor deposition source in response to the control signals generated by the computer.

9. The system of claim 8, wherein the vapor deposition source is a magnetron sputtering deposition source.

10. The system of claim 8, wherein the substrate is a flat substrate.

11. The system of claim 8, wherein the substrate is an optic having nonzero curvature.

12. The system of claim 8, wherein the substrate is an optic having a figure to be corrected by deposition of the film on said optic, and wherein the source flux modulation recipe is such that deposition of the film onto the optic achieves a desired correction of said figure of the optic.

13. The system of claim 8, wherein the vapor deposition apparatus also includes:

a second vapor deposition source operable at each of a number of applied power levels and having a known flux distribution at each of the applied power levels, wherein the platter drive assembly is configured to rotate the platter to sweep the substrate sequentially across the vapor deposition source and the second vapor deposition source, the source flux modulation recipe is a modulation recipe for achieving both said predetermined thickness profile of the film deposited on the substrate and a second predetermined thickness profile of a second film deposited on the substrate as a result of sweeping said substrate across the second vapor deposition source with a constant sweep velocity while the second vapor deposition source is operated in accordance with said source flux modulation recipe, and the controller is configured to operate the vapor deposition source in response to a first subset of the control signals; and a second controller, coupled to the programmed computer and to the second vapor deposition source, and configured to operate the second vapor deposition source in response to a second subset of the control signals generated by the computer.

14. The system of claim 13, wherein the vapor deposition apparatus also includes:

a second substrate mounted to the rotatable platter, wherein the platter drive assembly is configured to rotate the platter to sweep each of the substrate and the second substrate sequentially across the vapor deposition source and the second vapor deposition source, the source flux modulation recipe is a modulation recipe for achieving said predetermined thickness profile of the film and said second predetermined thickness profile of the second film deposited on the substrate, a third predetermined thickness profile of a third film deposited on the second substrate as a result of sweeping said second substrate across the vapor deposition source with a constant sweep velocity while the vapor deposition source is operated in accordance with said source flux modulation recipe, and a fourth predetermined thickness profile of a fourth film deposited on the second substrate as a result of sweeping said second substrate across the second vapor deposition source with a constant sweep velocity while the second vapor deposition source is operated in accordance with said source flux modulation recipe.

\* \* \* \* \*